(12) United States Patent
Ross et al.

(10) Patent No.: US 6,570,770 B1
(45) Date of Patent: May 27, 2003

(54) HANDLE INTEGRATING MECHANICAL FUNCTIONS WITH ELECTRONIC STATUS INDICATORS AND ADJUSTMENT FEATURE

(75) Inventors: Stanton W. Ross, Simi Valley, CA (US); Terry Lee Erskine, Camarillo, CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

(21) Appl. No.: 09/586,877

(22) Filed: Jun. 5, 2000

(51) Int. Cl.[7] ................................................. H05K 5/00
(52) U.S. Cl. ........................ 361/752; 361/861; 361/800; 361/796; 174/51 R; 174/35
(58) Field of Search ................................ 361/752, 818, 361/816, 788, 796, 800, 714, 715, 724, 730, 753, 760; 174/35 R, 51 R

(56) References Cited

U.S. PATENT DOCUMENTS

| | | | |
|---|---|---|---|
| 3,573,558 A | * 4/1971 | Babcock ..................... 361/680 |
| 3,744,864 A | * 7/1973 | Schmitz | |
| 4,102,554 A | * 7/1978 | Reimer | |
| 4,441,140 A | * 4/1984 | Richard ..................... 361/386 |
| 4,499,523 A | * 2/1985 | Gillet et al. ................. 361/693 |
| 4,656,461 A | * 4/1987 | Morsch et al. | |
| 4,760,659 A | * 8/1988 | Watabe ..................... 40/124.02 |
| 4,931,909 A | * 6/1990 | Backes ....................... 361/399 |
| 4,941,841 A | * 7/1990 | Darden et al. .............. 361/685 |
| 5,075,926 A | * 12/1991 | Jeong | |
| 5,099,391 A | * 3/1992 | Maggelet et al. | |
| 5,140,346 A | * 8/1992 | Goto et al. .................. 346/145 |
| 5,260,851 A | * 11/1993 | Chiou | |
| D373,176 S | * 8/1996 | Booth et al. | |
| 5,557,499 A | * 9/1996 | Reiter et al. ............. 312/223.2 |
| 5,595,316 A | * 1/1997 | Gallarelli et al. | |
| 5,822,184 A | * 10/1998 | Rabinovitz .................. 361/685 |
| 6,000,097 A | * 12/1999 | Russell | |
| 6,041,956 A | * 3/2000 | Kao ........................... 220/4.02 |
| 6,362,416 B1 | * 3/2002 | Denny et al. .......... 174/35 GC |

* cited by examiner

Primary Examiner—David Martin
Assistant Examiner—Hung Bui
(74) Attorney, Agent, or Firm—O'Melveny & Myers LLP

(57) ABSTRACT

A handle for electronic components is provided that retains the mechanical function of prior art handles and provides for integration of electronic features, such as indicator lights and associated labels, on a portion of the handle. The present handle is mechanically attached to its associated electronic package, and is also electrically connected to the electronics within the package to provide for operation of the handle's integrated electronic features. Electronic features, for example, status indicators and adjustment features, are positioned on the handle so that the features are available at the front of the component, without using space on the front panel of the electronic package. The handle is especially useful for compact, rack-mounted electronics units.

42 Claims, 5 Drawing Sheets

HANDLE INTEGRATING MECHANICAL FUNCTIONS WITH ELECTRONIC STATUS INDICATORS AND ADJUSTMENT FEATURE

BACKGROUND OF THE INVENTION

1. Field of the Invention

The present invention relates to handles for electronic equipment, and more particularly to mechanical handles for inserting and extracting electronic equipment into rack and tray assemblies, and for carrying electronic equipment.

2. Description of Related Art

Electronic equipment such as computer networking components are often mounted in rack and tray assemblies that provide an organized storage and access system for many such separately mounted packages. Rack and tray assemblies provide for insertion and extraction of the equipment into and out of the assembly by sliding. Packaged electronic circuit assemblies, also called components or units, are inserted and extracted on a front side of the rack and tray assembly. The components are typically constructed with a front panel on the side of the component that faces the front side of the rack and tray assembly. Components typically include a housing for their internal components, and the front panel forms part of this housing. Front panels often present various indicator lights, switches, and other electronic circuit elements on their exterior surface, positioned to face the front side of the rack and tray assembly. Such front panel electronic circuit elements may include, for example, indicator lights, meters, switches, control dials, control buttons, and various types of sockets. Front panels are also typically provided with labels or nameplates, and may include other features such as ventilation ports. Additionally, rack-mounted components are typically provided with a handle mounted on or near the front panel for inserting and removing the component from rack and tray assemblies. to the prior art are mechanical parts used principally for pulling the electronic components when removing them from rack and tray assemblies, or for carrying the components. Such handles for rack-mounted components resemble and function like commonly used cabinet hardware, for example, pull handles on desk drawers. Although prior art handles function effectively as pull handles, they have several disadvantages. In general, prior art handles do not make efficient use of the limited amount of area available on the panel space of the front panel. Space on the front panel is needed for various operational features as described above, and prior art handles cannot readily be incorporated into many modern electronic units, which are often very compact. A further disadvantage of prior art handles is that they often obscure or block access to features mounted on the front panel. There is therefore a need for a new type of handle for electronic components that overcomes the disadvantages of prior art handles.

SUMMARY OF THE INVENTION

The present invention provides a handle for electronic components. A handle according to the present invention retains the mechanical function of prior art handles and provides for integration of electronic features and circuit elements, such as indicator lights and associated labels, on a portion of the handle. The present handle is mechanically attached to its associated electronic component, and is also electrically connected to the electronics within the component to provide for operation of the handle's integrated electronic features. Electronic, features, for example, status indicators and adjustment features, are positioned on the handle so that the features are available at the front of the component, without using panel space on the front panel. These items can then be mounted in front of other elements or features on the front panel, thereby effectively increasing the amount of panel space available. In some cases, the increase in panel space will make it possible to make the associated electronic package more compact than would otherwise be possible. For example, the compactness of prior art rack-mounted power supply units is limited by the need to provide a front panel large enough to provide space for needed ventilation ports, indicator lights, and other features. By relocating the indicator lights to a handle according to the present invention, more of the front panel space can be used for ventilation ports, thereby allowing the power supply to be made more compact.

The handle is preferably mounted so that the visibility of its integrated electronic features is enhanced by being out in front of the component. The handle is preferably formed using a molding process, such as plastic injection molding, that provides for integration of mechanical and electronic features, flexibility in aesthetic styles, and low costs. A printed circuit board having the electronic features mounted on it is preferably incorporated into the handle structure to facilitate mass production of electronic assemblies, thereby reducing component cost.

A more complete understanding of the invention will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the need for a more compact, convenient, and multifunctional mechanical handle for use with a rack-mounted electronic unit or other electronic component. In the detailed description that follows, like element numerals are used to describe like elements illustrated in one or more of the figures.

Figure 1:
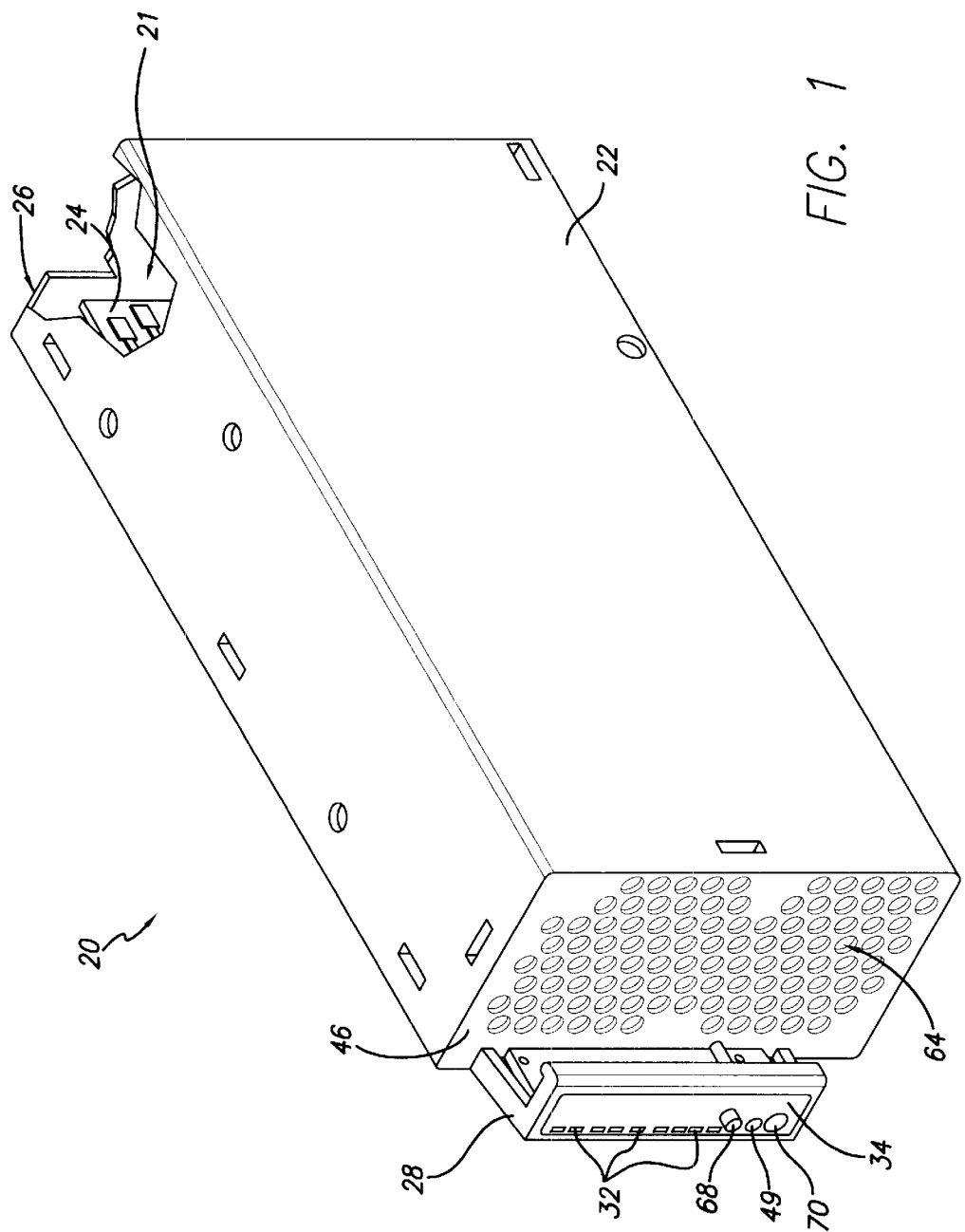
FIG. 1 is a perspective view of an electronic assembly according to the invention.

Referring to FIG. 1, an electronics component 20 according to the present invention is depicted. Component 20 is comprised of an electronic circuit assembly 24, in this case an electronic power supply, enclosed within a housing 22, and provided with a pull/carry handle 28. The component 20 is preferably configured for mounting in a rack and tray assembly; however, the invention would be similarly applicable to other types of mountings and to freestanding assemblies. Component 20 may be an electronic component of any type. "Electronic component" means a component that is primarily for generating, or operating on, a digital or analog signal or electrical power, such as a computer network device, a general purpose computer, or a test and measurement apparatus. An electronic component has essentially no mechanical function, and thus a mechanical handle is incidental to its primary function.

Housing 22 is comprised of six essentially planar rectangular sides, including front panel 46, configured for insertion into a standard tray. The sides typically define a tubular rectangular enclosure with two planar ends, which are often attached to the interior components with an interior frame or chassis. Two or more of the sides are typically joined together as part of a larger piece. Housing 22 is typically formed from sheet metal, such as aluminum, steel, or other EMI shielding material. Various types and configurations for housings are well known in the art, but all share the common characteristic of providing a shell enclosing and secured to the interior electronics, from protecting and shielding the electronics from the surrounding environment. The present invention may be adapted for use with a wide variety of housings and electronic components.

Front panel 46, forming part of housing 22, is provided with various operational features. In the illustrated example, the operational features comprise ventilation holes 64 for cooling component 20. In other embodiments, the operational features may include switches, indicator lights, circuit breakers, fuses, control knobs, push buttons, power sockets, and data sockets.

Handle 28 is attached to component 20 at front panel 46. The handle 28 is preferably provided with a nameplate 34 mounted to panel 50, and includes one or more indicator lights 32. An access hole 49 is additionally included, through which an adjustment tool, such as a screwdriver, may be inserted for adjusting an a circuit element in the interior of the handle or component. Various electronic circuit elements or other features may be included in handle 28 in lieu of or in addition to the indicator lights 32 and access hole 49. For example, alternative electronic circuit elements may include a control knob 68, a push button 70, power sockets, and/or data sockets. Indicator lights 32 (and other electronic circuit elements, if included) are preferably electrically connected to a circuit of component 20. Elements such as control knobs and push buttons may be used for control of an internal electrical device in such circuit, such as a switch or variable resistor. In general, any electronic circuit element which is small enough to fit on the panel 50 of handle 28, which is electrically connected to electronic circuit assembly 24 inside component 26, and which would otherwise be mounted on front panel 46, may be included on handle 28.

It is advantageous to locate indicator lights 32 on handle 28 in order to conserve space on front panel 46 when necessary. For example, in FIG. 1, an assembly including a power supply component 21 is depicted. The ventilation requirements of the power supply are such that nearly all of the entire surface of front panel 46 is required for ventilation ports 64. Placing the indicator lights 32 on handle 28 instead of on front panel 46 makes it possible to reduce the size of front panel 46 and make the entire component 20 more compact. Consequently, more assemblies 20 can be located in the same amount of space within a tray. The handle is preferably positioned well away from the front panel, so that the air flow through the ventilation ports is not impeded.

Figure 2A:
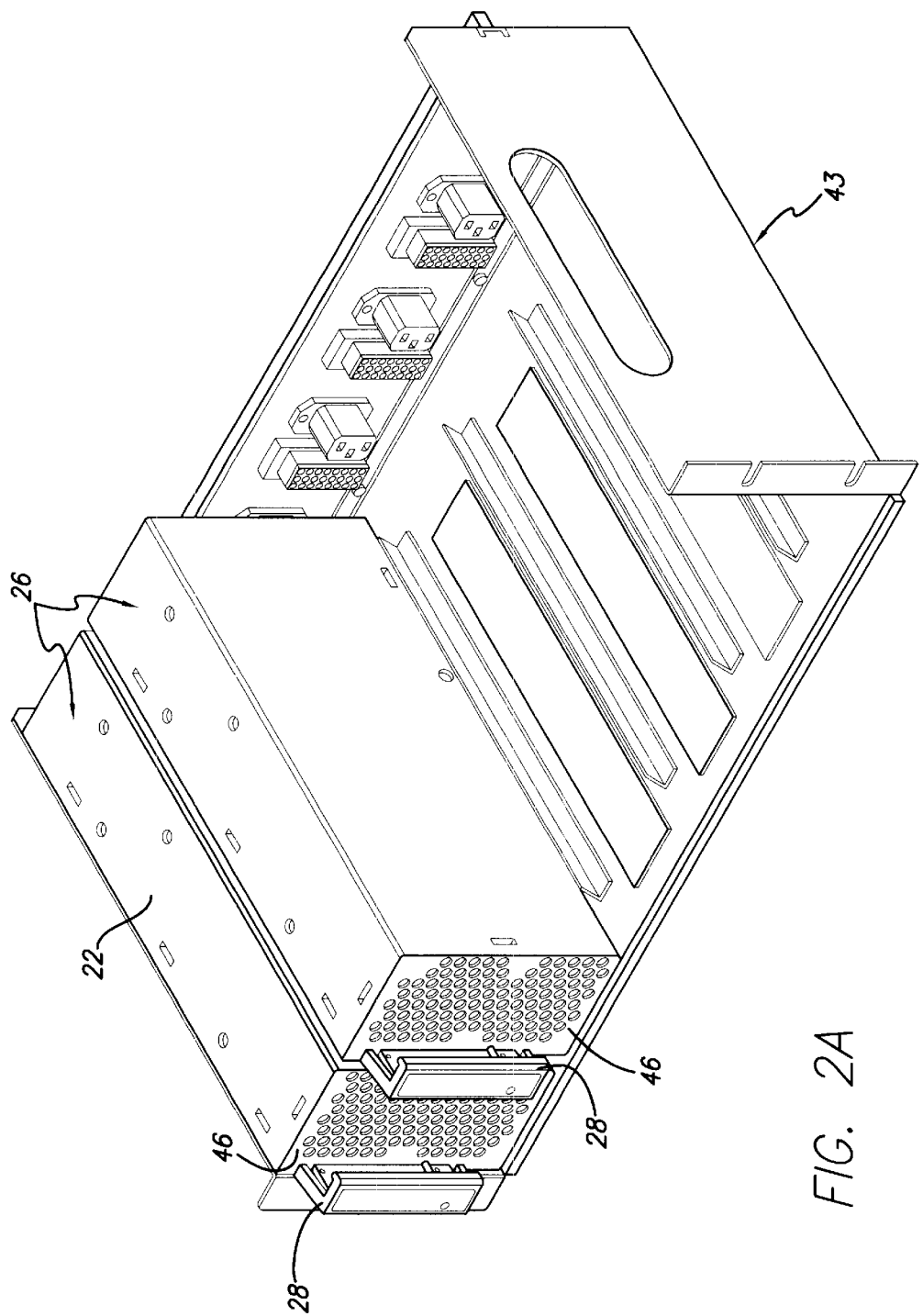
FIG. 2A is a perspective view of two electronic assemblies, each including a handle according to the invention, mounted in a 6-unit tray for inserting into a rack assembly.
Figure 2B:
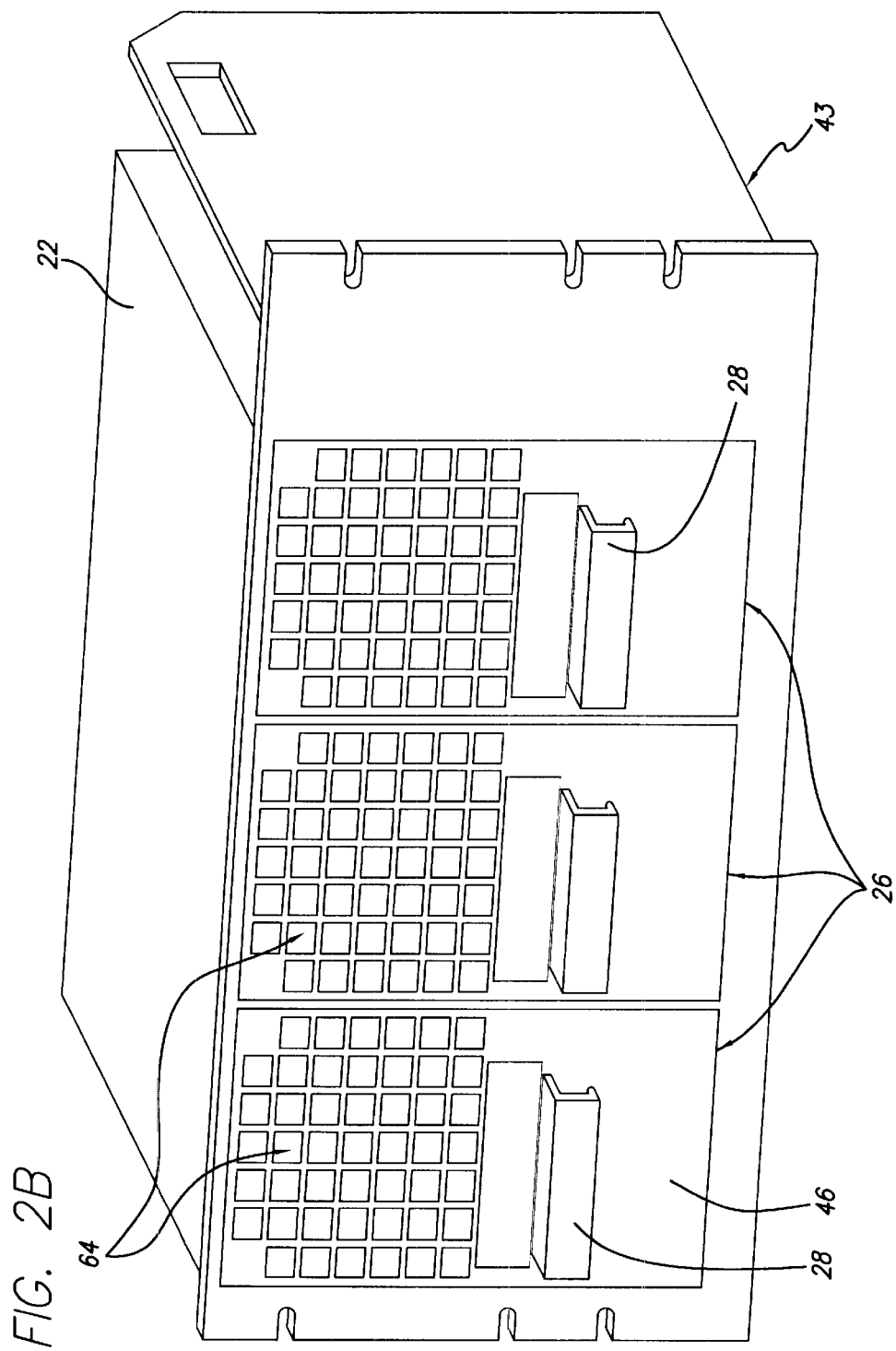
FIG. 2B is a perspective view of three electronic assemblies mounted in a 3-unit tray, showing an application of the invention to a different type of component than depicted in FIG. 2A.

FIGS. 2A and 2B illustrate multiple components 26 mounted in trays 43 for insertion into a rack (not shown). FIG. 2A illustrates application of the invention to a first type of power supply unit, and FIG. 2B illustrates application of the invention to a second type of power supply unit. Rack and tray assemblies, a rack portion of which are shown in FIGS. 2A and 2B, are well known in the art for mounting electronic components. In order to minimize use of expensive floor space, electronic components designed for insertion into rack and tray assemblies are made as compact as possible. Consequently, when assembled together with like components in trays, only the front panel 46 is accessible and available for use and placement of electronic circuit elements such as indicator lights, push buttons, potentiometers, slides, and control knobs, and other operational features such as sockets and ventilation ports. In some cases, the area available on front panel 46 may be a limiting factor in the ability to make the associated component more compact. In these cases, a handle according to the present invention may be used for placement of some or all of the electronic circuit elements which would otherwise be placed on front panel 46, thereby making it possible to reduce the size of front panel 46 and the associated electronic component. The handle 28 may be oriented vertically, as shown in FIG. 2A, or horizontally, as shown in FIG. 2B, depending on the rack and tray configuration.

Figure 3A:
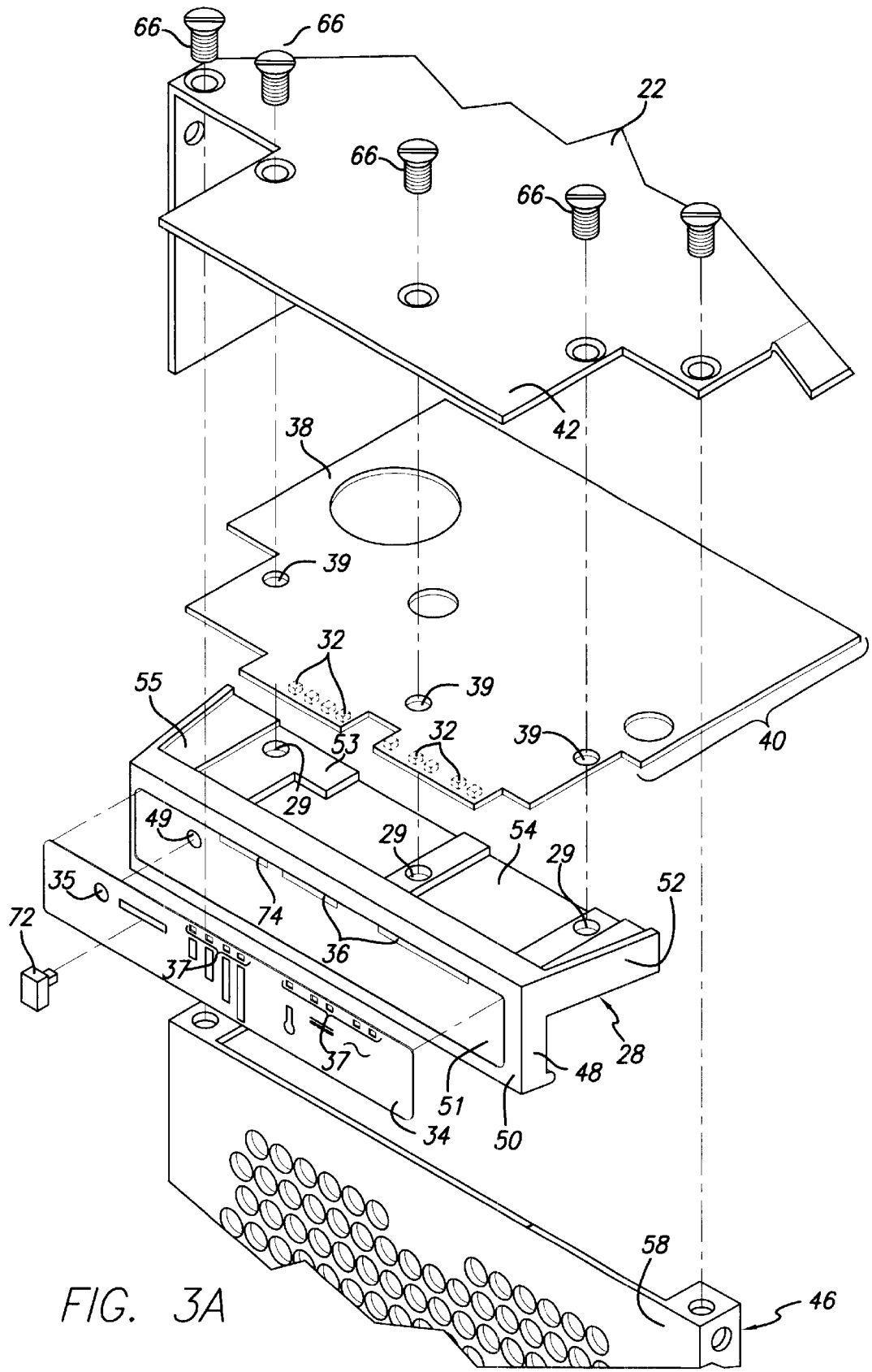
FIG. 3A is an exploded perspective view showing components of a handle assembly according to the present invention.

Referring to FIG. 3A, details and components of a handle assembly according to the present invention are depicted in exploded perspective view. Handle 28 includes hand hold 48, panel 50, and tang 52. Handle 28 is preferably formed from an injection molded plastic in order to reduce costs but may be constructed by a variety of alternative methods which are well known in the art. Hand hold 48 may be formed in a variety of alternative shapes configured to be grasped by a user's hand for pulling of electronics assemblies out of trays. In FIG. 3A, an L-shaped handle is depicted, having the hand hold 48 and panel 50 on one branch of the L and the tang 52 on another branch of the L. Alternative handle shapes for use with the invention include knobs, T-shapes and U-shapes, and any number of similar shapes for which it is possible to define a hand hold for grasping, a panel for mounting electronic circuit elements, and a tang, bracket, or base for connecting the handle to the electronic component. Additional details of the handle shape according to the preferred embodiment are provided in connection with FIGS. 4A and 4B below.

Handle 28 is further configured and mounted for insertion and extraction of an electronics assembly into and from a rack, and for carrying of electronics assemblies When necessary. Handle 28 is preferably strong enough to support the entire weight of an assembly and withstand repeated insertion and extraction of the assembly. On a portion of hand hold 48 facing away from front panel 46, a panel 50 is provided. Panel 50 is provided with one or more cavities 36 for revealing electronic circuit elements 32 which are mounted in the handle. Panel 50 is preferably provided with a slight recess 51 for mounting nameplate 34.

Nameplate 34 is preferably constructed from a transparent or translucent plastic material, which is printed on the reverse side with text, symbols and a background, according to techniques known in the art. Selected areas of nameplate 34 are not printed on but are left clear, forming windows 37 for electronic circuit elements 32. In FIG. 3A, the electronic circuit elements pictured are indicator lights. When activated, the indicator lights 32 produce light which is visible through cavities 36 and windows 37. Additionally, openings 74 may be provided in nameplate 34 to provide for access to operational features such as push buttons, slide 72, or sockets. For example, a through hole 35, aligning with access hole 49 in handle 28, may be provided to provide for access to an internal adjusting device, such as a variable resistor for adjusting an output voltage. Various other methods may be used for constructing and forming a name plate or label on panel 50, or the name plate may be omitted entirely, depending on the operation and requirements of the electronic circuit assembly 24.

Indicator lights 32, or other electronic circuit elements for viewing on panel 50, are preferably surface mounted on printed circuit board 38. Use of printed circuit board 38 facilitates mass production of the handles 28 and their electronic components, reducing costs of the assembly. Printed circuit board 38 is positioned in recess 53 of handle 28, so that mounting holes 39 in printed circuit board 38 are aligned with threaded holes 29 in handle 28. When so positioned, indicator lights 32 rest in channel 54 and are visible in front panel 50 through cavities 36. In addition, a rear portion 40 of the printed circuit board 38 extends past tang 52 and inside of housing 22 of component 20, when assembled.

Printed circuit board 38 and handle 28 are secured to each other and to housing 22 by fasteners 66 inserted through flange 42 and threaded into threaded holes 29. Flange 42 is preferably integrally attached to housing .22 at the top edge of housing 22. When assembled, flange 42 preferably rests in recess 55 of handle 28, and covers the exposed top portion of the printed circuit board. Other methods of mounting may be used, so long as the method selected is sufficiently strong to allow for handling of the electronics component 20 using handle 28.

Figure 3B:
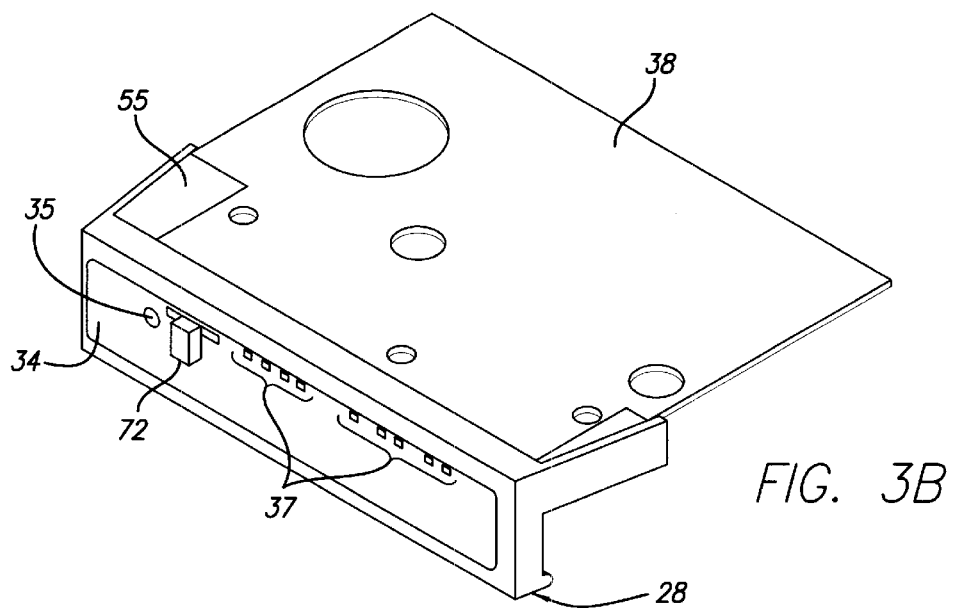
FIG. 3B is a perspective view of a partial handle assembly according to the present invention.

Printed circuit board 38 incorporates one or more circuits which are connected to indicator lights 32 or other electronic circuit elements. The circuits are also connected inside of the housing 22 to operating components of the electronic circuit assembly 24. Thus, the operation of electronic circuit assembly 24 may be indicated and controlled by electronic circuit elements mounted on panel 50 of handle 28. Printed circuit board 38 is preferably positioned within recess 53 of tang 52, so that the top surface of the printed circuit board is approximately even with the bottom of recess 55, as shown in FIG. 3B. When so positioned, handle 28 partially encloses the circuit board and flange 42 fits over the top of circuit board 38, enclosing and protecting it from the top, and securing the component to handle 28. The portion of the upper surface of printed circuit board 38 which extends over handle 28 preferably serves as a mounting face 41 for flange 42, thereby securing printed circuit board 38 in place by compression between the flange and handle 28. The handle in turn is secured by compression against the printed circuit board 38 in recess 53 and against the housing in recess 55.

Referring again to FIG. 3A, front panel 46 is configured to permit a rear portion 40 of printed circuit board 38 to enter housing 22. Front panel 46 is assembled to housing 22 using screws, clips, or other fasteners known in the art, and is positioned behind handle 28. Front panel 46 is comprised of a sheet 58 having two sides and provided with a plurality of ventilation ports 64 to form a planar mesh. Typically, sheet metals such as aluminum or steel are used for construction of front panel 46. Plastic sheets which have been modified to have EMI shielding characteristics are also known in the art and may be used for construction of front panel 46. For rack and tray mounted components, sheet metals are preferred because of their durability, strength, fracture resistance, and stiffness. For other assemblies where ruggedness is less of a consideration, plastic sheets may be preferred because of their lower cost.

Figure 4A:
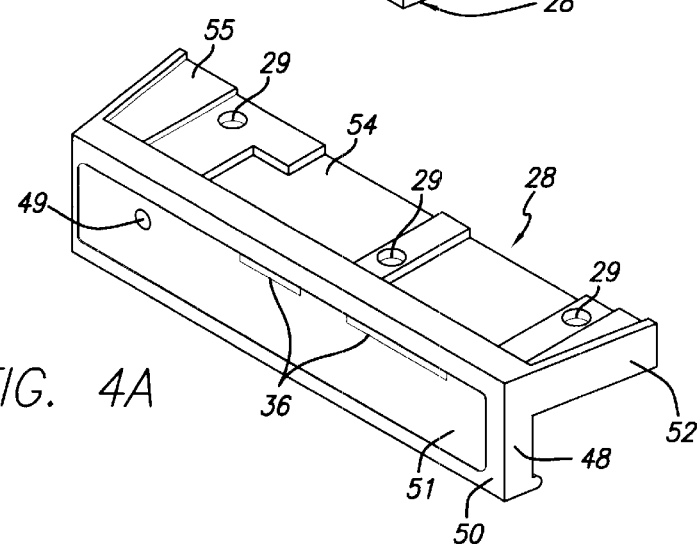
FIG. 4A is a perspective view of a handle according to the invention, viewed from the above front of the handle.
Figure 4B:
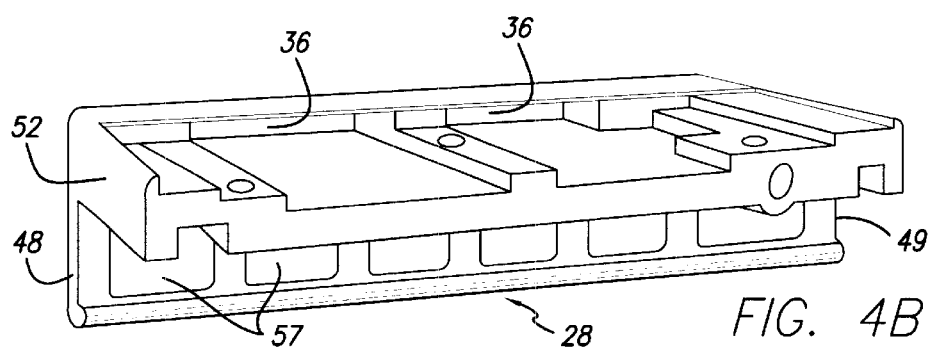
FIG. 4B is a perspective view of a handle according to the invention, viewed from the above rear of the handle.

Additional details of handle 28 are shown in FIGS. 4A and 4B. Referring to FIG. 4A, cavities 36 and access hole 49 are provided in panel 50 of handhold 48. As shown in the rear perspective view of FIG. 4B, cavities 36 have their rear openings positioned in channel 54, thereby revealing indicator lights or other electronic circuit elements on a printed circuit board mounted in channel 54 from the front of panel 50. Similarly, a rear aperture of access hole 49 (visible in FIG. 4B) is preferably aligned with an adjusting component on a printed circuit board 38 mounted in channel 54, to permit adjustment from the front of panel 50. Various configurations of access holes and cavities may be provided in handle 28 for revealing or providing access to electronic circuit elements connected to circuits of the electronic assembly, and the invention is not limited to the configuration described above.

Having thus described a preferred embodiment of the invention, it should be apparent to those skilled in the art that certain advantages of the within system have been achieved. It should also be appreciated that various modifications, adaptations, and alternative embodiments thereof may be made within the scope and spirit of the present invention. For example, an L-shaped handle has been illustrated, but it should be apparent that the inventive concepts described above would be equally applicable to various shapes of handles for electronic components, such as knobs, T-shaped handles, and U-shaped handles. Furthermore, a handle according to the present invention may be used with components that are not mounted in rack and tray assemblies, to save panel space, or merely for aesthetic reasons. The invention is further defined by the following claims.

What is claimed is:

1. An electronic component comprising:
    a housing enclosing an electronic circuit assembly;
    a front panel connected to said housing and covering an end of said housing; and,
    a handle spaced apart from said front panel and structurally connected to said housing, wherein at least a portion of said handle is outside of said housing and configured for handling said electronic component in its entirety, and wherein an electronic circuit element of said electronic circuit assembly is mounted in said handle in front of said front panel, is connected to said electronic circuit assembly through said front panel, and is positioned to be visible from outside of said housing.

2. The component according to claim 1, wherein said component is configured for mounting in a rack and tray assembly.

3. The component according to claim 1, wherein said electronic circuit assembly further comprises an electric power supply.

4. The component according to claim 1, wherein said electronic circuit assembly further comprises at least one of a computer network device, a general purpose computer, or an electronic test and measurement apparatus.

5. The component according to claim 1, wherein said handle further comprises a nameplate.

6. The component according to claim 1, wherein said handle further comprises a cavity revealing at least a portion of said electronic circuit element.

7. The component according to claim 1, wherein said component further comprises a printed circuit board attached to said handle.

8. The component according to claim 7, wherein said printed circuit board extends inside said housing.

9. The component according to claim 7, wherein said printed circuit board is electrically connected to said electronic circuit assembly.

10. The component according to claim 7, further comprising a flange extending from said housing, wherein said handle and said printed circuit board are attached to said flange.

11. The component according to claim 1, wherein said electronic circuit element further comprises an indicator light.

12. The component according to claim 1, wherein said electronic circuit element further comprises one of a control knob, push button, or slide.

13. The component according to claim 1, wherein said electronic circuit element further comprises a socket.

14. The component according to claim 1, further comprising a flange extending from said component, wherein said handle is attached to said flange.

15. The component according to claim 1, wherein said housing further comprises an EMI shield.

16. The component according to claim 1, wherein said housing is configured for inserting said component into a rack and tray assembly, and wherein said handle is mounted to a front panel of said component.

17. The assembly according to claim 1, wherein said handle is comprised of injection molded plastic.

18. The electronic component according to claim 1, wherein the front panel further comprises a ventilation hole.

19. The electronic component according to claim 1, wherein the front panel further comprises a circuit element.

20. A handle for an electronics component, said handle comprising:
- a hand hold for being grasped by a user's hand;
- a panel on said hand hold, said panel having a cavity for revealing at least one electronic circuit element;
- a tang extending from said hand hold, said tang having a channel for containing at least one electrical conductor; and
- a mounting face on said tang for attaching said handle to said electronics component.

21. The handle according to claim 20, wherein said channel is connected to said cavity in said panel.

22. The handle according to claim 20, wherein said handle further comprises a nameplate mounted on said panel.

23. The handle according to claim 20, wherein said handle further comprises a printed circuit board attached to said tang.

24. The handle according to claim 23, wherein said printed circuit board is configured to connect a circuit of said circuit board to an external circuit.

25. The handle according to claim 23, wherein a circuit of said printed circuit board is electrically connected to an electronic circuit element revealed by said cavity.

26. The handle according to claim 25, wherein said electronic circuit element further comprises an indicator light.

27. The handle according to claim 25, wherein said electronic circuit element further comprises one of a control knob, push button, or slide.

28. The handle according to claim 25, wherein said electronic circuit element further comprises a socket.

29. The handle according to claim 18, wherein said handle is comprised of injection molded plastic.

30. A handle for an electronics component, said handle comprising:
- a hand hold for being grasped by a user's hand;
- a panel on said hand hold, said panel having a cavity for revealing at least one electronic circuit element;
- a tang extending from said hand hold;
- a mounting face on said tang for attaching said handle to said electronics component; and
- a printed circuit board attached to said tang, wherein said printed circuit board extends beyond an end of said tang.

31. A front panel for an electronic component, said front panel comprising:
- a sheet of material having a first side and a second side;
- a handle mounted to said sheet and extending from said first side of said sheet, said handle having a hand hold positioned away from said sheet, a display panel on said hand hold, and a tang supporting said hand hold, said tang having a channel for containing at least one electrical conductor; and
- an electronic circuit element mounted in said display panel on said hand hold, wherein said electronic circuit element is visible from said first side of said sheet, and wherein said electronic circuit element is adapted to be connected by said at least one electrical conductor to a circuit assembly of said electronic component that is behind said second side of said sheet.

32. The front panel according to claim 31, wherein said sheet contains a plurality of ventilation ports.

33. The front panel according to claim 31, wherein said handle further comprises a nameplate mounted on said display panel.

34. The front panel according to claim 31, wherein said handle further comprises a printed circuit board attached to said handle.

35. The front panel according to claim 34, wherein said printed circuit board extends to said second side of said sheet.

36. The front panel according to claim 34, wherein said printed circuit board contains said at least one electrical conductor to connect said printed circuit board to said electronic component.

37. The front panel according to claim 31, wherein a circuit of said printed circuit board is connected to said electronic circuit element.

38. The front panel according to claim 31, wherein said electronic circuit element further comprises an indicator light.

39. The front panel according to claim 31, wherein said electronic circuit element further comprises one of a control knob, push button, or slide.

40. The front panel according to claim 31, wherein said electronic circuit element further comprises a socket.

41. The front panel according to claim 31, wherein said handle is comprised of injection molded plastic.

42. The front panel according to claim 31, wherein said sheet is substantially planar and rectangular.

* * * * *